(12) United States Patent
Xu et al.

(10) Patent No.: US 11,764,444 B2
(45) Date of Patent: Sep. 19, 2023

(54) CONNECTING ASSEMBLY, BATTERY MODULE, BATTERY GROUP, AND DEVICE USING BATTERY MODULE AS POWER SOURCE

(71) Applicant: CONTEMPORARY AMPEREX TECHNOLOGY CO., LIMITED, Ningde (CN)

(72) Inventors: Wencai Xu, Ningde (CN); Xuguang Wang, Ningde (CN); Jihua Yao, Ningde (CN); Mu Qian, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 6 days.

(21) Appl. No.: 17/564,012

(22) Filed: Dec. 28, 2021

(65) Prior Publication Data
US 2022/0123442 A1    Apr. 21, 2022

Related U.S. Application Data

(63) Continuation of application No. PCT/CN2020/121719, filed on Oct. 17, 2020.

(30) Foreign Application Priority Data

Oct. 21, 2019    (CN) .......................... 201910999593.X

(51) Int. Cl.
*H01M 50/519*    (2021.01)
*B60L 50/60*    (2019.01)
(Continued)

(52) U.S. Cl.
CPC ........... *H01M 50/519* (2021.01); *B60L 50/66* (2019.02); *H01M 10/425* (2013.01);
(Continued)

(58) Field of Classification Search
CPC ........... H01M 50/519; H01M 10/4207; H01M 10/425; H01M 2220/20; H01M 50/284;
(Continued)

(56) References Cited

U.S. PATENT DOCUMENTS

2010/0062329 A1    3/2010    Muis
2010/0151281 A1    6/2010    Kwag et al.
(Continued)

FOREIGN PATENT DOCUMENTS

| CN | 102544616 A | 7/2012 |
|---|---|---|
| CN | 203134923 U | 8/2013 |

(Continued)

OTHER PUBLICATIONS

Extended European Search Report dated May 18, 2022 received in European Patent Application No. EP 20880133.2.
(Continued)

*Primary Examiner* — Michael C Zarroli
(74) *Attorney, Agent, or Firm* — Scully, Scott, Murphy & Presser, P.C.

(57) ABSTRACT

The application discloses a connecting assembly, a battery module, a battery group, and a device using the battery module as a power supply. The connecting assembly includes a plurality of connecting sheets, a sampling assembly, and an insulating film, where the plurality of connecting sheets are configured to connect battery cells of the battery module; the sampling assembly includes a circuit board and a sampling terminal connected to the circuit board; the sampling terminal is connected to the plurality of connecting sheets, the insulating film is provided at one side of the sampling assembly and the plurality of connecting sheets, and the insulating film connects the sampling assembly to the plurality of connecting sheets to form an integral structure with the sampling assembly and the plurality of con- (Continued)

necting sheets, an insulating film through hole is provided in a region of the sampling assembly covered by the insulating film.

17 Claims, 11 Drawing Sheets

(51) Int. Cl.
  *H01M 10/42* (2006.01)
  *H01R 13/66* (2006.01)
  *H02J 7/00* (2006.01)
(52) U.S. Cl.
  CPC .... *H01M 10/4207* (2013.01); *H01R 13/6683* (2013.01); *H02J 7/0063* (2013.01); *H01M 2220/20* (2013.01); *H01R 2201/26* (2013.01); *H05K 2201/09009* (2013.01)
(58) Field of Classification Search
  CPC ... H01M 50/507; H01M 50/209; B60L 50/66; H01R 13/6683; H01R 2201/26; H02J 7/0063; H05K 2201/09009; Y02E 60/10
  See application file for complete search history.

(56) References Cited

U.S. PATENT DOCUMENTS

| | | |
|---|---|---|
| 2012/0148876 A1 | 6/2012 | Zeng et al. |
| 2014/0220391 A1 | 8/2014 | Fujii et al. |
| 2016/0372796 A1 | 12/2016 | Nishihara |
| 2018/0190960 A1 | 7/2018 | Harris et al. |
| 2019/0296315 A1 | 9/2019 | Reimer et al. |
| 2019/0319232 A1 | 10/2019 | Ryu et al. |
| 2020/0044223 A1* | 2/2020 | Takase ................ H01M 10/482 |
| 2020/0343516 A1 | 10/2020 | Harris et al. |

FOREIGN PATENT DOCUMENTS

| | | |
|---|---|---|
| CN | 204029949 U | 12/2014 |
| CN | 204029950 U | 12/2014 |
| CN | 106328875 A | 1/2017 |
| CN | 206022485 U | 3/2017 |
| CN | 206878083 U | 1/2018 |
| CN | 107785526 A | 3/2018 |
| CN | 109103405 A | 12/2018 |
| CN | 209087963 U | 7/2019 |
| CN | 209087964 U | 7/2019 |
| CN | 210744018 U | 6/2020 |
| CN | 210744068 U | 6/2020 |
| CN | 211045640 U | 7/2020 |
| DE | 102010005017 A1 | 7/2011 |
| DE | 102011016373 A1 | 10/2012 |
| EP | 2244319 A1 | 10/2010 |
| EP | 2538469 A2 | 12/2012 |
| EP | 2835846 A1 | 2/2015 |
| EP | 3474345 A1 | 4/2019 |
| JP | 2015022798 A | 2/2015 |
| WO | 2016150306 A1 | 9/2016 |

OTHER PUBLICATIONS

International Search Report dated Jan. 19, 2021 issued in PCT/CN2020/121719.
Notice of Reasons for Refusal dated May 29, 2023 received in Japanese Patent Application No. JP 2022-523330.

* cited by examiner

CONNECTING ASSEMBLY, BATTERY MODULE, BATTERY GROUP, AND DEVICE USING BATTERY MODULE AS POWER SOURCE

CROSS-REFERENCE TO RELATED APPLICATIONS

The present application is a continuation of International Application No. PCT/CN2020/121719, filed on Oct. 17, 2020, which claims priority to Chinese Patent Application No. 201910999593.X, filed to the Chinese Patent Office on Oct. 21, 2019 and entitled "CONNECTING ASSEMBLY, BATTERY MODULE, BATTERY GROUP, AND DEVICE USING BATTERY MODULE AS POWER SOURCE", the entire content of which is incorporated herein by reference.

TECHNICAL FIELD

The present application relates to the technical field of battery and in particular relates to a connecting assembly, a battery module, a battery group, and a device using the battery module as a power supply.

BACKGROUND

Currently, each original equipment manufacturer in the automobile industry are developing in a direction of coupe model, and conventional modified electric vehicles should also reflect advantages and characteristics of fast acceleration of the electric vehicles. Therefore, a demand for a fast acceleration working condition will be increasingly common, and the requirements for the battery module's assembling efficiency, structural strength and safety performance will also become increasingly high.

A circuit board and a connecting sheet of the battery module can be connected into an integral structure through an insulating film. However, upon expansion of a battery cell due to charging and discharging, a relative displacement will be generated between the battery cells. Effected by an expansion force, the insulating film is likely to be torn off, and the circuit board and a part that connects the circuit board to a sampling terminal is also likely to be fractured, resulting in failed sampling and structure.

SUMMARY

The present application aims to provide a connecting assembly, a battery module, a battery group, and a device using the battery module as a power supply to improve the safety of the battery module.

A first aspect of the present application provides a connecting assembly, including a plurality of connecting sheets configured to connect battery cells of the battery module, a sampling assembly including a circuit board and a sampling terminal connected to the circuit board, the sampling terminal being connected to the plurality of connecting sheets, and an insulating film provided at one side of the sampling assembly and the plurality of connecting sheets, and the insulating film connecting the sampling assembly and the plurality of connecting sheets to form an integral structure with the sampling assembly and the plurality of connecting sheets, and an insulating film through hole being provided in a region of the sampling assembly covered by the insulating film.

In some embodiments, the circuit board is provided with a circuit board opening, and a position of the insulating film through hole corresponds to a position of the circuit board opening.

In some embodiments, the circuit board is provided with a connecting portion connected to the sampling terminal, and the circuit board opening is disposed close to the connecting portion.

In some embodiments, the circuit board opening includes a circuit board through hole passing through the circuit board and a first groove formed by a side of the circuit board being recessed inward, the circuit board through hole includes a first transverse section extending along a transverse direction of the circuit board, and the first groove is located in an extending direction of the first transverse section and has a gap with the first transverse section.

In some embodiments, the circuit board through hole further includes a longitudinal section extending along a longitudinal direction of the circuit board, and the first transverse section is located at a first end of the longitudinal section and communicates to the longitudinal section.

In some embodiments, the circuit board through hole further includes a second transverse section extending along the transverse direction of the circuit board, and the second transverse section is located at a second end of the longitudinal section and communicates to the longitudinal section.

In some embodiments, on the longitudinal direction of the circuit board, a distance between the second transverse section and the connecting portion is greater than a distance between the first transverse section and the connecting portion.

In some embodiments, the circuit board opening further includes a second groove formed by a side of the circuit board being recessed inward, and the second groove and the first groove are respectively located at two sides of the connecting portion.

In some embodiments, a position of the insulating film through hole is disposed in correspondence to a position of the circuit board opening, the insulating film through hole includes a first segment corresponding to the position of the circuit board through hole and a second segment extending from a position corresponding to the second groove to a position corresponding to the first groove.

In some embodiments, the insulating film includes a first insulating film and a second insulating film that are respectively attached to two sides of the sampling assembly and the plurality of connecting sheets, the first insulating film is provided with a first insulating film through hole and the second insulating film is provided with a second insulating film through hole.

In some embodiments, the first insulating film through hole and the second insulating film through hole are disposed in a misalignment manner.

In some embodiments, a distance range between hole walls disposed close to the first insulating film through hole and the second insulating film through hole is [−0.5 mm, 3 mm].

In some embodiments, a position of the first insulating film through hole and a position of the second insulating film through hole are opposite, and a width of one insulating film through hole of the first insulating film through hole and the second insulating film through hole is smaller than a width of the other insulating film through hole.

In some embodiments, a width a of a narrow insulating film through hole of the first insulating film through hole and the second insulating film through hole is in a range of [0 mm, 0.5 mm] and a width b of a wide insulating film through hole of the first insulating film through hole and the second insulating film through hole is in a range of [0.5 mm, 3 mm].

A second aspect of the present application provides a battery module including a plurality of battery cells disposed in a stack manner and the connecting assembly provided by the first aspect of the present application, where the plurality of connecting sheets are connected to an electrode lead of the plurality of battery cells.

A third aspect of the present application provides a battery group including a box body and the battery module provided by the second aspect of the present application, where the battery module is accommodated into the box body.

A fourth aspect of the present application provides a device using a battery module as a power supply, the apparatus including a driving apparatus and the battery module provided by the second aspect of the present application, where the driving apparatus is configured to provide a driving force to the device, and the battery module is configured to provide electrical energy to the driving apparatus.

Based on the technical solutions provided by the present application, a connecting assembly includes a plurality of connecting sheets, a sampling assembly, and an insulating film, where the plurality of connecting sheets are configured to connect battery cells of the battery module; the sampling assembly includes a circuit board and a sampling terminal connected to the circuit board; the sampling terminal is connected to the plurality of connecting sheets, the insulating film is provided at one side of the sampling assembly and the plurality of connecting sheets, and the insulating film connects the sampling assembly to the plurality of connecting sheets to form an integral structure with the sampling assembly and the plurality of connecting sheets, and an insulating film through hole is provided in a region of the sampling assembly covered by the insulating film. In the manufacturing process of the battery module, the battery cell expands after charging and discharging many times, causing a relative displacement between the battery cells, and the insulating film through hole provided on the insulating film can also release an expansion force to prevent the insulating film from being torn off and sampling failure, thereby improving the safety of the battery module.

The exemplary embodiments of the present application are described in details below by referring to the following drawings, and other characteristics and their advantages of the present application will become clear.

BRIEF DESCRIPTION OF THE DRAWINGS

The drawings described herein are intended for a further understanding of the present application and constitute a part of the present application. Example embodiments of the present application and descriptions thereof are intended to explain the present application, and do not constitute any inappropriate limitation on the present application. In the drawings.

Figure 1:
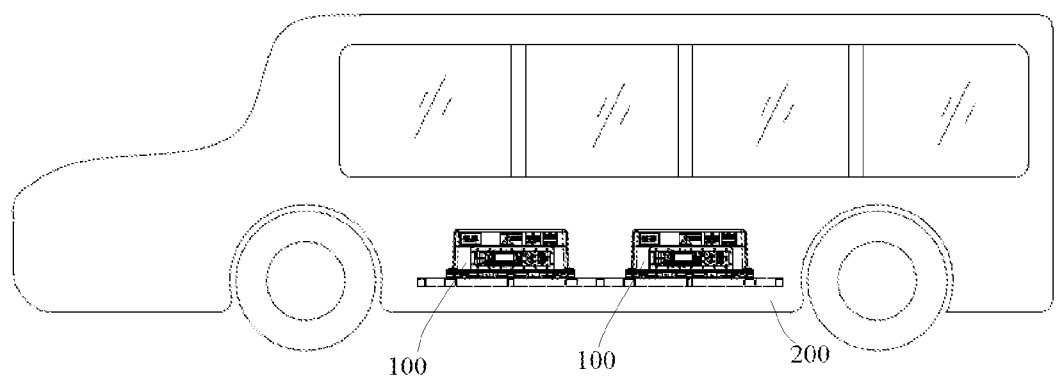
FIG. 1 is a structural diagram of a vehicle in embodiments of the present application.

The reference signs of each drawing respectively denote:
1, connecting assembly;
11, connecting sheet;
12, first insulating film; 121, first insulating film through hole;
13, second insulating film; 131, second insulating film through hole;
14, sampling assembly; 141, circuit board; 1411, connecting portion; 1412, first circuit board through hole; 1412a, first transverse section groove; 1412b, longitudinal section groove; 1412c, second transverse section groove; 1413, first groove; 1414, gap;
1415, second groove; 1416, connecting neck; 142; sampling terminal;
2, end plate;
3, insulating cover;
4, battery cell; 41, positive electrode lead; 42, negative electrode lead;
5, first lace;
6, second lace;
10, battery module;
20, upper box body;
30, lower box body;
100, battery group;
200, vehicle body;
P, first segment; Q, second segment.
X1, a length direction of a battery module; Y1, a width direction of a battery module, Z1, a height direction of a battery module;
X2, a length direction of a connecting assembly; Y2, a width direction of a connecting assembly; Z2, a height direction of a connecting assembly;
X3, a longitudinal direction of a circuit board; Y3, a transverse direction of a circuit board;
a, a width of a narrow insulating film through hole;
b, a width of a wide insulating film through hole;

c, a distance between hole walls disposed close to a first insulating film through hole and a second insulating film through hole;

d, a width of a first insulating film through hole;

e, a width of a second insulating film through hole;

f, a distance between a second transverse section and a connecting portion; and h, a distance between a first transverse section and a connecting portion;

DESCRIPTION OF EMBODIMENTS

The following clearly and completely describes the technical solutions in the embodiments of the present application with reference to the drawings in the embodiments of the present application. Apparently, the described embodiments are merely some but not all of the embodiments of the present application. The following description on the at least one exemplary embodiment is actually illustrative only, but not to make any limitation to the present application and its application or use. All other embodiments obtained by a person of ordinary skill in the art based on the embodiments of the present application without creative efforts shall fall within the protection scope of the present application.

Unless otherwise described additionally and specifically, the components, relative arrangement of steps, number expressions and values as described in these embodiments do not constitute any limitation to the scope of the present application. Meanwhile, it should be understood that to facilitate description, a size of each part shown in the drawings is not drawn according to an actual proportional relationship. A technique, method and device known for a person of ordinary skill in the art is not likely to be discussed in details. However, at an appropriate situation, the technique, method and device should be regarded as a part of the granted description. Of all examples shown and discussed herein, any specific value should be interpreted as only exemplary, but not to serve as a limitation. Therefore, other examples of exemplary embodiments may have different values. It should be noted that similar markers and letters denote similar items in the drawings below. Therefore, once one item is defined in one drawing, it does not need to be further discussed in a subsequent drawing.

To facilitate description, relative terms of space can be used herein, such as "above . . . ", "over . . . ", "on an upper surface of . . . " and "upper" etc., which are used for describing a spatial positional relationship of one device or characteristic shown in the drawings with other devices or characteristics. It should be understood that relative terms of space aim to include different orientations in use or operation other than orientations of a device described in the drawing. For example, if a device in an drawing is inverted, the device after being described as "above other element or structure" or "over other device or structure" is located as "below other device or structure" or "under other device or structure". Thus, exemplary terms "above . . . " may include two orientations: "above . . . " and "below . . . ". The device can also be defined in other different manners and corresponding interpretations are made to relative description of space used herein.

In the following, the structure of the battery module in embodiments of the present application, and the structure of the connecting assembly in the embodiments are described in details according to FIG. 1 to FIG. 21.

Embodiments of the present application provide a device using a battery module 10 as a power supply, a battery group 100, a battery module 10 and a connecting assembly 1. The device using a battery module 10 as a power supply includes a battery module 10 and a driving apparatus for providing a driving force to the device, and the battery module 10 provides electrical energy to the driving apparatus. The driving force of the device can all be electrical energy and can be partially electrical energy and partially other energy (for example mechanic energy). For example, the device can further include an engine and other power source that provides mechanic energy. A device is within the protection scope of the present application as long as the device uses the battery module 10 as a power supply.

The device in embodiments of the present application can be a vehicle, a ship, a small aircraft, and other mobile devices. With a vehicle as an example, the vehicle in embodiments of the present application can be a new energy vehicle. The new energy vehicle can be a pure electric vehicle or can be a hybrid power vehicle or an extended-range vehicle etc. As shown in FIG. 1, the vehicle includes a battery group 100 and a vehicle body 200, where the battery group 100 is disposed in the vehicle body 200, and includes at least one battery module 10. The vehicle body 200 is provided with a driving motor, which is electrically connected to the battery group 100. The battery group 100 provides electric energy for the driving motor. The driving motor is connected through a transmission mechanism to wheels on the vehicle body 200 so as to drive the vehicle to travel ahead. Specifically, the battery group 100 can be horizontally disposed at bottom of the vehicle body 200.

Figure 2:
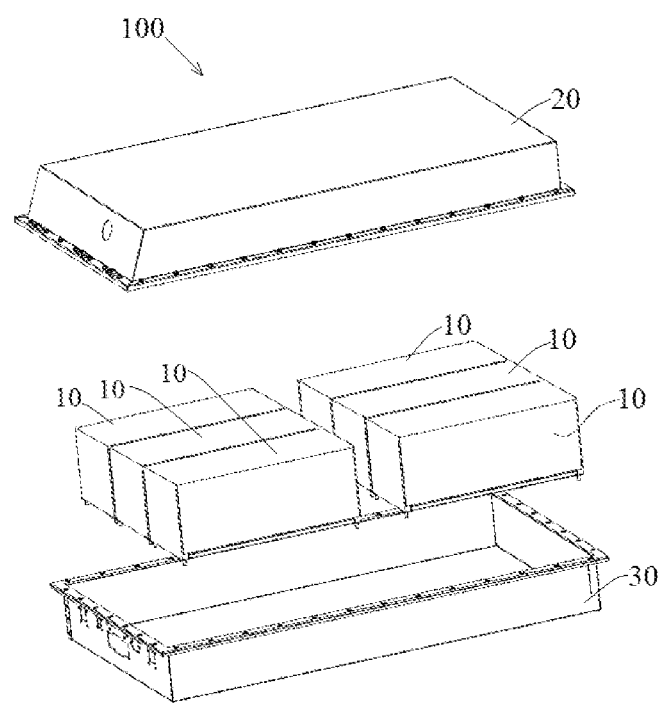
FIG. 2 is a structural diagram of a battery group in FIG. 1.

The battery module 100 in embodiments of the present application includes at least one battery module 10. Specifically in the embodiments, as shown in FIG. 2, the battery group 100 in the embodiments includes a plurality of battery modules 10 and a box body for accommodating the plurality of battery modules 10. The box body is provided with an accommodating cavity, and the plurality of battery modules 10 are arranged in the accommodating cavity. Specifically, the box body in the embodiments is a box-shaped box body and includes a lower box body 30 which accommodates the battery module 10 and an upper box body 20 which covers the lower box body 30. In embodiments not shown in other drawings, the box body can also be a frame-shaped box body, a disk-shaped box body or other shapes of box body.

Figure 3:
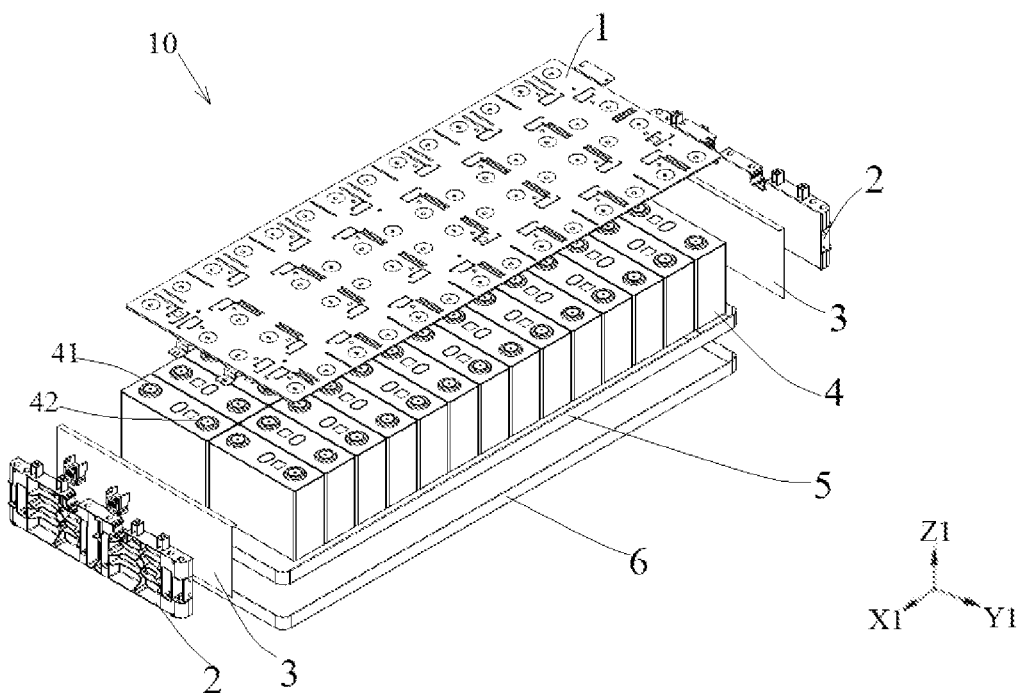
FIG. 3 is a structural diagram of a battery module in FIG. 2.

As shown in FIG. 3, the battery module 10 in embodiments of the present application includes a plurality of battery cells 4 and a frame structure for fixing the plurality of battery cells 4. The plurality of battery cells 4 are stacked and arranged in a row along the length direction X1. The frame structure includes an end plate 2, a first lace 5 and a second lace 6, where the end plate 2 is located at two ends on the length direction X1 of the battery module 10, and the end plate 2 is configured to limit movement of the battery cells 4 along the length direction X1 of the battery module 10. The first lace 5 and the second lace 6 are configured to connect the plurality of stacked battery cells 4.

In embodiments not shown in other drawings, the frame structure may further include side plates located at two sides on the width direction Y1 of the battery module, the side plates are connected to the end plate and enclosed to form the frame structure. In addition, the battery module 10 may not be provided with a frame structure. When the battery module 10 is fixed into the box body of the battery group 100, the plurality of stacked battery cells 4 are fixed through a skeleton structure of the box body, such as side of the box body, reinforcing beams and the like; or the battery cells 4 can be further fixed to the box body through bonding or other manners.

The battery module 10 in the embodiments further includes an insulating cover 3, which is disposed between the frame structure and the battery cells 4 to perform a function of insulation. Specifically, in the embodiments, the insulating cover 3 is located between the end plate 2 and the battery cells 4, and between the lace and the battery cells 4.

The battery cell 4 in the embodiments includes an electrode lead. Specifically, each of the battery cells 4 includes a positive electrode lead 41 and a negative electrode lead 42. In the battery module 10, the plurality of battery cells 4 are electrically connected in manners like series and/or parallel etc. Moreover, the adjacent battery cells 4 are connected through a connecting sheet 11. For example, when the battery cells 4 are connected in series, the positive electrode lead 41 of one battery cell 4 is connected to the negative electrode lead 42 of another battery cell 4 through the connecting sheet 11; or when the battery cells 4 are connected in parallel, the positive electrode lead 41 of one battery cell 4 is connected to the positive electrode lead 41 of another battery cell 4 through the connecting sheet 11.

Figure 4:
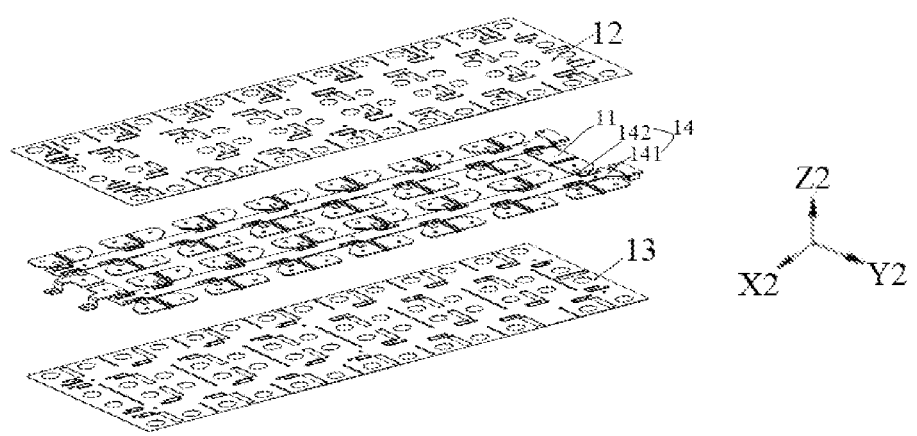
FIG. 4 and FIG. 5 are a schematic diagram of an exploded structure of a connecting assembly in FIG. 3.
Figure 5:
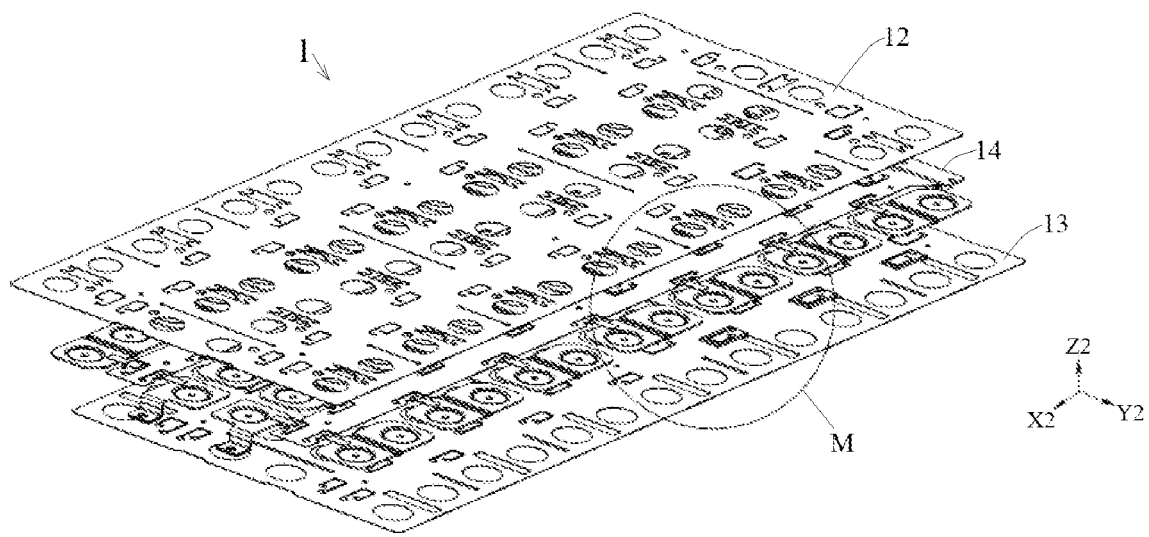
Figure 6:
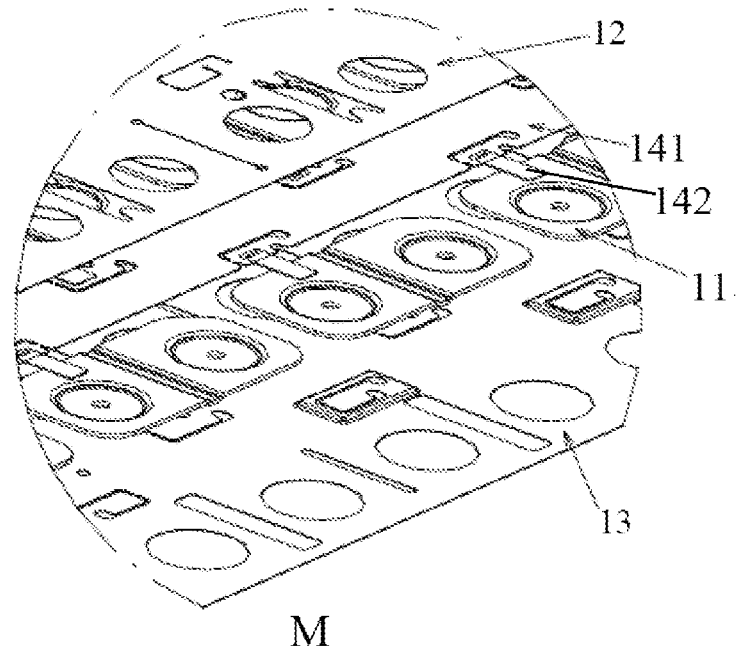
FIG. 6 is an enlarged structural diagram of part M in FIG. 5.

As shown in FIG. 3 to FIG. 5, the connecting assembly 1 in the embodiments includes a plurality of connecting sheets 11, a sampling assembly 14 and an insulating film, where the sampling assembly 14 includes a circuit board 141 and a sampling terminal 142 connected to the circuit board 141, the sampling terminal 142 is connected to the plurality of connecting sheets 11, the insulating film is provided at one side of the sampling assembly 14 and the plurality of connecting sheets 11, and the insulating film connects the sampling assembly 14 and the plurality of connecting sheets 11 to form an integral structure with the sampling assembly 14 and the plurality of connecting sheets 11, thus improving assembling efficiency of the battery module 10. An insulating film through hole is provided in a region of the sampling assembly 14 covered by the insulating film. In the manufacturing process of the battery module 10, when the connecting sheets 11 of the connecting assembly 1 are connected to an electrode lead of the battery cells 4, there may be a deviation between the connecting sheets 11 and the electrode lead due to a manufacturing error, such that the connecting sheets 11 stretch the sampling assembly 14 connected to it. In this case, it is extremely easy to cause a failure of connection between the connecting sheets 11 and the sampling assembly 14 or to cause the sampling assembly 14 itself to be fractured, resulting in failed sampling and even tearing off the insulating film, which causes a connection failure of the connecting assembly 11. By providing the insulating film through hole, the sampling assembly 14 is made to have an activity space, which can avoid failed sampling caused by a manufacturing error. In the manufacturing process of the battery module 10, the battery cells 4 expand after charging and discharging many times, causing a relative displacement between the battery cells 4, and the insulating film through hole provided on the insulating film can also release an expansion force to prevent the insulating film from being torn off and sampling failure, thereby improving the safety of the battery module.

The sampling assembly 14 and the plurality of connecting sheets 11 in the embodiments are integrated into one by bonding the insulating films, hot pressing or injection molding process, to facilitate assembling of the battery module 10 so as to improve production efficiency. In some embodiments, the sampling assembly 14 and the plurality of connecting sheets 11 are integrated into one by hot pressing insulating films to facilitate manufacturing of the connecting assembly 1.

Specifically, in the embodiments, the circuit board 141 can be flexible printed circuit (FPC), printed circuit board (PCB) and flexible flat cable (FFC) etc. The circuit board 141 is composed of a sampling line and an insulating material that wraps the sampling line. The sampling terminal 142 can be a nickel sheet, a copper sheet and an aluminum sheet etc. connected to the sampling line in the circuit board 141. The sampling terminal 142 can also be a part of the sampling line inside the circuit board 141 that extends out. Specific limitations are not made herein, as long as collection of information of the battery cells 4 can be implemented. The specific sampling line is electrically connected to the sampling terminal 142 to realize a sampling function. In some embodiments, the circuit board 141 is a flexible circuit board, such as FPC; and the sampling terminal 142 is a nickel sheet. The flexible circuit board is flexible and small in volume such that internal space can be saved for the assembled battery module 10.

After the sampling assembly 14 and the plurality of connecting sheets 11 are integrated by hot pressing the insulating film, a position of the circuit board 141 is restricted and cannot move, resulting in an increase in the rigidity of the entire connecting assembly 1. So when expansion occurs to the battery module 10, it is easy for the circuit board 141 to stretch under the expansion force, thus causing failure of an electrical connection of the sampling line inside the circuit board 141. In order to reduce rigidity of the entire connecting assembly 1 to avoid sampling failure, as shown in FIG. 7 to FIG. 11, the circuit board 141 of the embodiments is provided with a circuit board opening, and a position of the insulating film through hole corresponds to a position of the circuit board opening.

Figure 8:
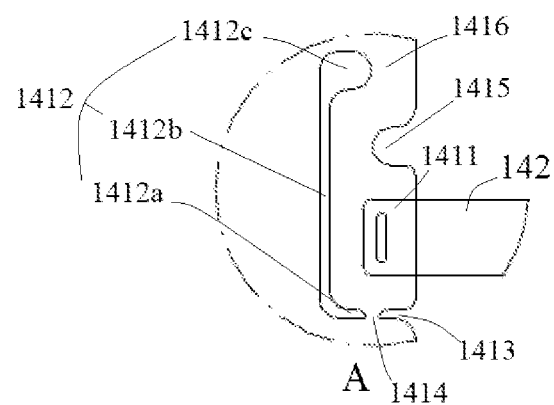
FIG. 8 is an enlarged structural diagram of part A in FIG. 7.
Figure 9:
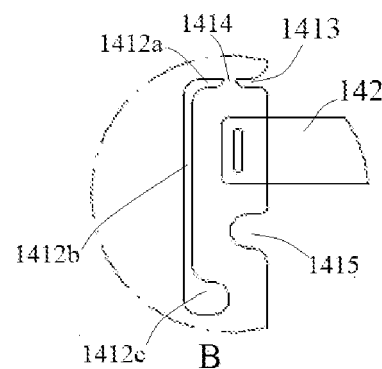
FIG. 9 is an enlarged structural diagram of part B in FIG. 7.

As shown in FIG. 8, the circuit board 141 is provided with a connecting portion 1411 connected to the sampling terminal 142, and the circuit board opening is disposed close to the connecting portion 1411. The sampling terminal 142 is connected to the connecting sheets 11. The connecting sheets 11 are connected to an electrode lead of the battery cells 4. Therefore, when the battery cells 4 are deformed upon charging and discharging, the connecting portion 1411 connecting the circuit board 141 to the sampling terminal 142 is a place where the force is applied. Thus, disposing the circuit board opening close to the connecting portion 1411 can better increase flexibility of the connecting assembly 1 close to the connecting portion 1411 When the circuit board 141 in the embodiments is vibrated, since the circuit board opening is provided on the circuit board 141, the circuit board 141 in the embodiments can absorb vibration of the circuit board 141 through deformation, thus ensuring connecting strength between the connecting portion 1411 and the sampling terminal 142.

Figure 7:
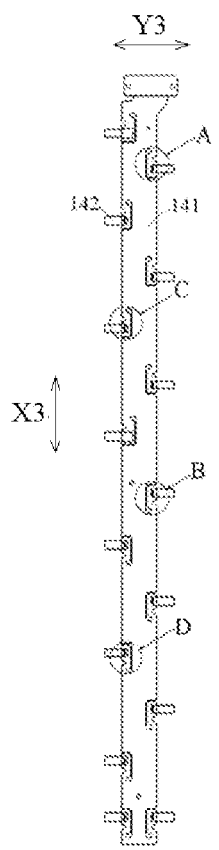
FIG. 7 is a structural diagram of a sampling assembly in FIG. 5.

As shown in FIG. 7, at different locations at two sides of the circuit board 141, a plurality of sampling terminals 142 which are disposed at an interval are connected. As shown in FIG. 8 to FIG. 11, for the sampling terminal 142 at different locations, the shape of the circuit board opening is substantially the same. According to the internal wiring of the circuit board 141, the direction of the circuit board opening can be properly adjusted. The structure of the circuit board opening at part A in FIG. 7 is described in details according to FIG. 8. Circuit board openings at part B, part C and part D of FIG. 7 are all obtained by the circuit board opening at part A through a certain rotational symmetry. Therefore, the structure can refer to the structure of the circuit board opening at part A can be referred to and it is not repeated herein.

As shown in FIG. 8, the circuit board 141 in the embodiments includes a connecting neck 1416 located at one side of the connecting portion 1411, and the interior of the connecting neck 1416 is provided with a sampling line.

In the embodiments, the circuit board opening includes a circuit board through hole 1412 passing through the circuit board 141 and a first groove 1413 formed by a side of the circuit board 141 being recessed inward, the circuit board through hole 1412 includes a first transverse section 1412a extending along a transverse direction Y3 of the circuit board 141, the first groove 1413 is located in an extending direction of the first transverse section 1412a and has a gap 1414 with the first transverse section 1412a. Before the circuit board 141 and the insulating film are hot pressed, a gap 1414 exists between the first transverse section 1412a and the first groove 1413, thus facilitating bonding between the circuit board 141 and the insulating film and facilitating flattening of the insulating film and the fixing of the sampling terminal 142 in the hot pressing process, thus improving production efficiency. When the sampling terminal 142 is deformed with the expansion of the battery cells 4, the sampling terminal 142 applies an acting force to the circuit board 141. With the increase of the acting force, the gap 1414 between the first groove 1413 and the first transverse section 1412a will be broken, thus making the connecting neck 1416 into a cantilever structure, resulting in easier deformation. The interior of the gap 1414 may be provided with a sampling line or may not be provided with a sampling line. When the sampling line is provided inside the gap 1414, the sampling line inside the gap 1414 is in a parallel relationship with the sampling line inside the connecting neck 1416. When the sampling line inside the gap 1414 is broken, the sampling line inside the connecting neck 1416 can also perform a sampling function. In some embodiments, the sampling line is not provided inside the gap 1414, which can reduce wiring difficulty of the sampling line inside the circuit board 141 and reduce cost.

Specifically, the first transverse section 1412a and the first groove 1413 of the embodiments are both provided narrowly, such that the gap 1414 is also narrow and easy to break under effect of the sampling terminal 142.

The circuit board through hole 1412 in the embodiments further includes a longitudinal section 1412b extending along a longitudinal direction X3 of the circuit board 141, and the first transverse section 1412a is located at a first end of the longitudinal section 1412b and communicates to the longitudinal section 1412b. The arrangement of the longitudinal section 1412b enables increase of the flexibility of the circuit board 141 in the embodiments.

In order to further improve flexibility of the circuit board 141, the circuit board through hole 1412 in the embodiments further includes a second transverse section 1412c extending along a transverse direction Y3 of the circuit board 141, and the second transverse section 1412c is located at a second end of the longitudinal section 1412b and communicates to the longitudinal section 1412b.

Figure 10:
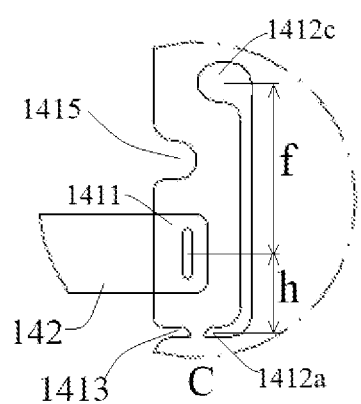
FIG. 10 is an enlarged structural diagram of part C in FIG. 7.
Figure 11:
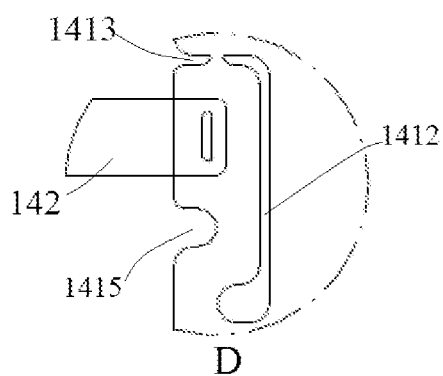
FIG. 11 is an enlarged structural diagram of part D in FIG. 7.

Referring to size marking in FIG. 10, in the longitudinal direction X3 of the circuit board 141, a distance f between the second transverse section 1412c and the connecting portion 1411 is greater than a distance h between the first transverse section 1412a and the connecting portion 1411. Providing in such a manner enables length of the connecting neck 1416 longer, which is advantageous to deformation of the circuit board 141.

In some embodiments, the circuit board opening further includes a second groove 1415 formed by a side of the circuit board 141 being recessed inward, and the second groove 1415 and the first groove 1413 are respectively located at two sides of the connecting portion 1411. The arrangement of the second groove 1415 enables easier deformation of the circuit board 141 when the connecting portion 1411 is under force, thus ensuring connecting stability between the sampling terminal 142 and the connecting portion 1411.

In the longitudinal direction X3 of the circuit board 141, the second groove 1415 and the second transverse section 1412c are disposed in a misalignment manner, thus reserving sufficient locations for internal wiring of the circuit board 141 and improving connecting strength of the connecting neck 1416.

It needs to be noted therein that the length direction X3 of the circuit board 141 in the embodiments is consistent with the length direction X1 of the battery module 10, which relates to arrangement of the battery cells 4 in the battery module 10. In embodiments not shown in other drawings, the longitudinal direction X3 of the circuit board can also be inconsistent with the length direction X1 of the battery module.

In order to further improve strength and connecting reliability of the connecting assembly 1, as shown in FIG. 4 and FIG. 5, the insulating film of the embodiments includes a first insulating film 12 and a second insulating film 13 that are respectively attached to two sides of the sampling assembly 14 and the plurality of connecting sheets 11, that is, the sampling assembly 14 and the plurality of connecting sheets 11 are located between the first insulating film 12 and the second insulating film 13. Specifically, the sampling assembly 14 and the plurality of connecting sheets 11 in the embodiments are hot-pressed and integrated into one with the first insulating film 12 and the second insulating film 13. In the height direction Z2 of the connecting assembly 1, the first insulating film 12 is located at an upper side and the second insulating film 13 is located at a lower side.

Figure 12:
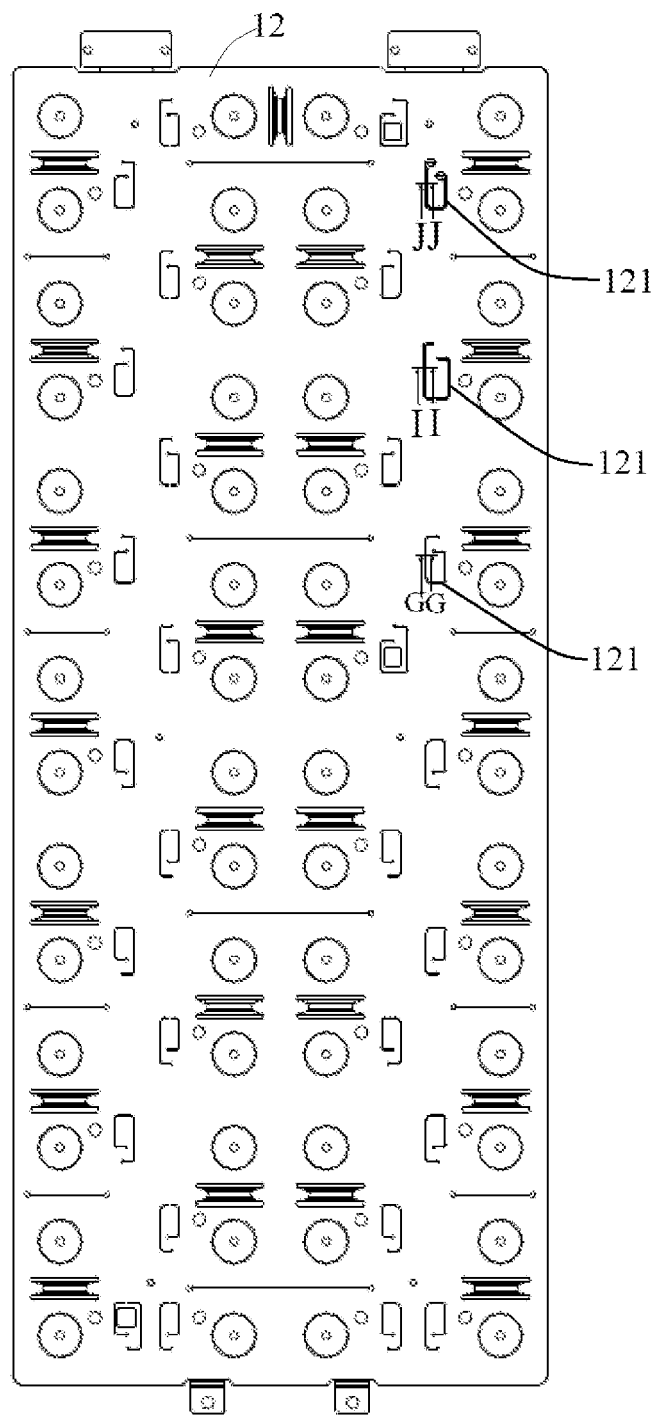
FIG. 12 is a top view structural diagram of a connecting assembly in FIG. 3.
Figure 16:
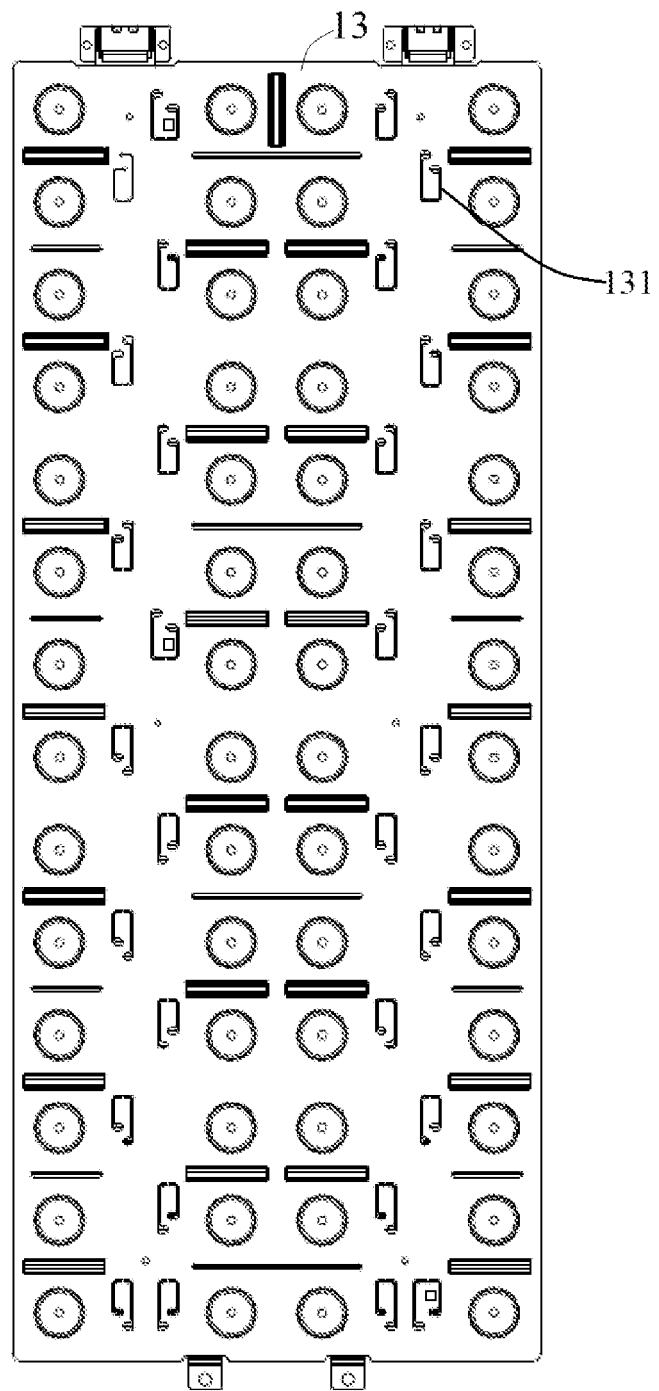
FIG. 16 is a bottom view structural diagram of a connecting assembly in FIG. 3.
Figure 17:
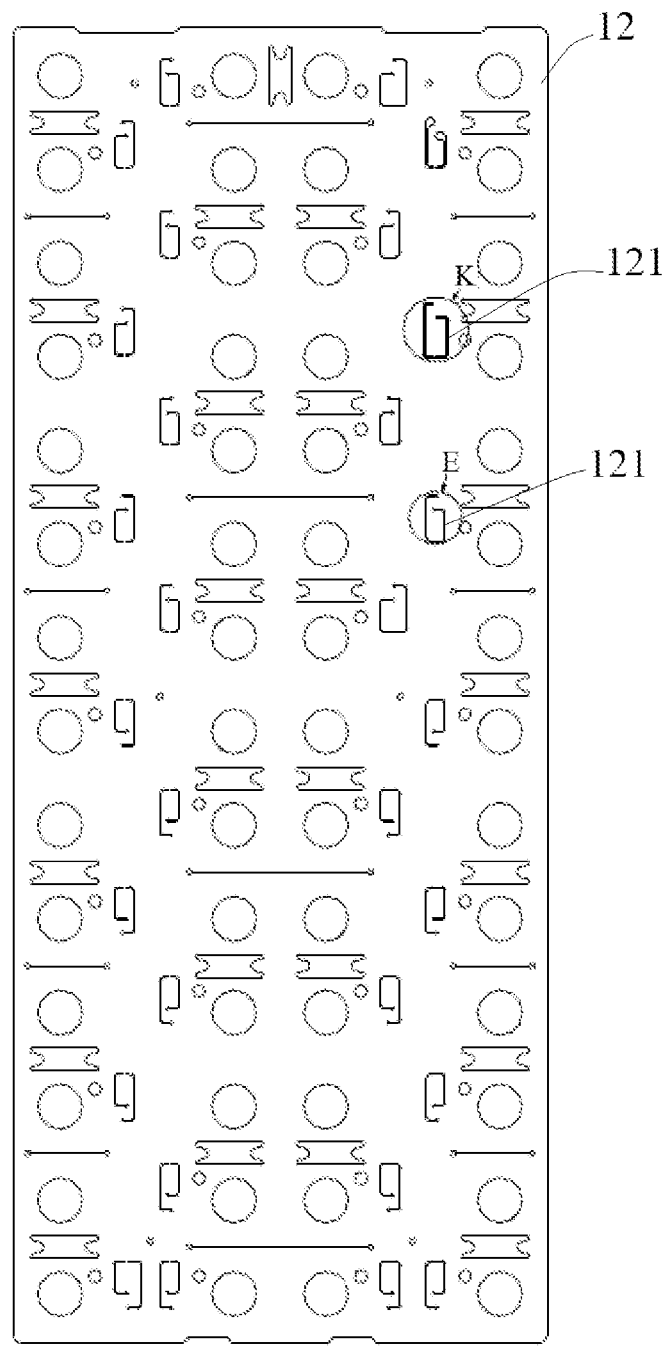
FIG. 17 is a structural diagram of a first insulating film in FIG. 4.
Figure 20:
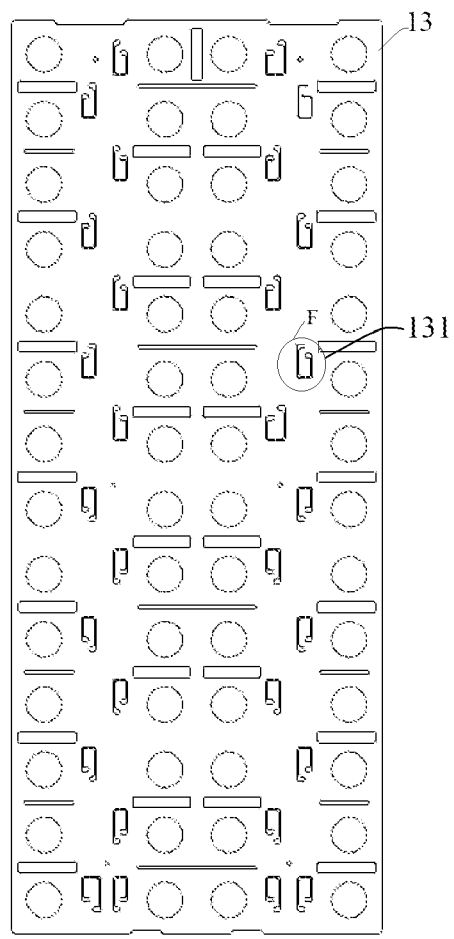
FIG. 20 is a structural diagram of a second insulating film in FIG. 4.

In order to prevent the insulating film from being torn off when the sampling assembly 14 and the plurality of connecting sheets 11 are being deformed, the first insulating film 12 and the second insulating film 13 in the embodiments are both provided with insulating film through holes. Specifically, as shown in FIG. 12 and FIG. 17, the first insulating film 12 is provided with a first insulating film through hole 121. As shown in FIG. 16 and FIG. 20, the second insulating film 13 is provided with a second insulating film through hole 131.

Figure 18:
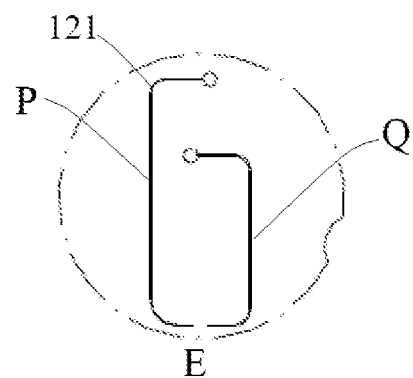
FIG. 18 is an enlarged structural diagram of part E in FIG. 17.
Figure 19:
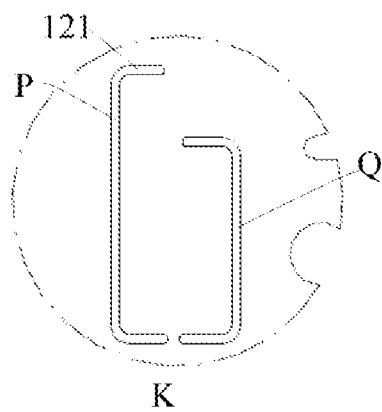
FIG. 19 is an enlarged structural diagram of part K in FIG. 17.
Figure 21:
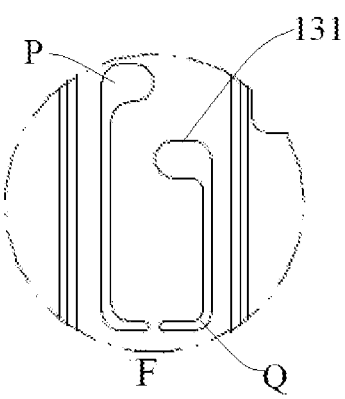
FIG. 21 is an enlarged structural diagram of part F in FIG. 20.

As shown in FIG. 18, FIG. 19 and FIG. 21, a position of the insulating film through hole in the embodiments is disposed in correspondence to a position of the circuit board opening, the insulating film through hole includes a first segment P corresponding to the position of the circuit board through hole 1412 and a second segment Q extending from a position corresponding to the second groove 1415 to a position corresponding to the first groove 1413. A position of the insulating film through hole in the embodiments is in correspondence to a position of the circuit board opening, such that after the insulating film and the circuit board 141 are connected into one, a cantilever structure is formed with a part of the circuit board 141 close to the sampling terminal 142, which is advantageous to deformation.

Figure 13:
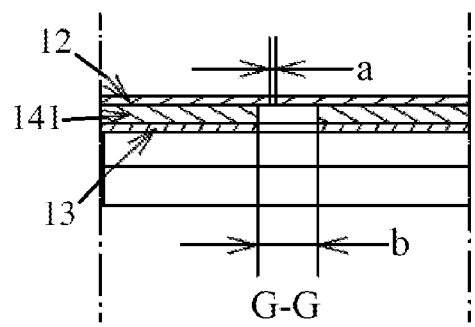
FIG. 13 is a structural diagram of a G-G section view in FIG. 12.
Figure 14:
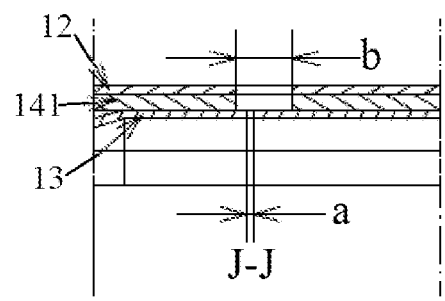
FIG. 14 is a structural diagram of a J-J section view in FIG. 12.

Since the first insulating film 12 and the second insulating film 13 in the embodiments are both provided with insulating film through holes and the circuit board 141 is also provided with a circuit board opening at a corresponding location, in order to avoid a metal particle falling inside the battery module 10 through the insulating film through holes and the circuit board opening to cause a short circuit, in one embodiment, as shown in FIG. 13 and FIG. 14, a position of the first insulating film through hole 121 and a position of the second insulating film through hole 131 are opposite, and a width of one insulating film through hole of the first insulating film through hole 121 and the second insulating film through hole 131 is smaller than a width of the other insulating film through hole of the first insulating film through hole 121 and the second insulating film through hole 131. That is, one of the first insulating film through hole 121 and the second insulating film through hole 131 is a narrow insulating film through hole and the other of the first insulating film through hole 121 and the second insulating film through hole 131 is a wide insulating film through hole. Specifically, as shown in FIG. 13, the first insulating film through hole 121 is a narrow insulating film through hole. As shown in FIG. 14, the second insulating film through hole 131 is a wide insulating film through hole. After the first insulating film 12 and the second insulating film 13 are molded integrally with the sampling assembly 14 by hot pressing, the whole connection assembly 1 performs a function of blocking the metal particle is the narrow insulating film through hole.

In order to enable the insulating film through hole to further prevent the metal particle falling inside the battery module 10 on the basis of releasing the expansion force, a width a of the narrow insulating film through hole in the embodiments is in a range of [0, 0.5 mm]. In some embodiments, the width a of the narrow insulating film through hole is smaller than or equal to 0.2 mm, thus achieving better effects in preventing the metal particle falling inside the battery module 10.

As shown in FIG. 13 and FIG. 14, a width of the circuit board opening in the embodiment is the same as a width of the wide insulating film through hole. In order to improve material utilization ratio of the circuit board 141 and help to release the expansion force, and further ensure a sufficient bonding area of the insulating film and the circuit board 141 on the basis of improving service life of the mold, a width b of the wide insulating film through hole in the embodiment is in a range of [0.5 mm, 3 mm]. In some embodiments, when the width b of the wide insulating film through hole is 1 mm, the bonding area of the insulating film and the circuit board 141 is larger and the material utilization ratio of the circuit board 141 is also higher.

Figure 15:
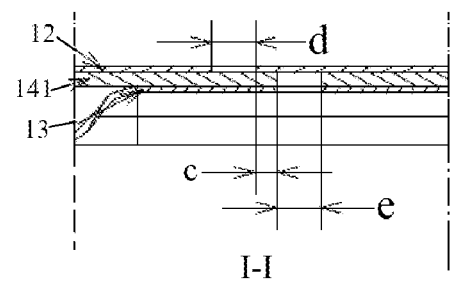
FIG. 15 is a structural diagram of a I-I section view in FIG. 12.

In order to avoid a metal particle falling inside the battery module 10 through the insulating film through hole and the circuit board opening to cause a short circuit, in another one embodiment, as shown in FIG. 15, the first insulating film through hole 121 and the second insulating film through hole 131 are disposed in a misalignment manner. Since the first insulating film through hole 121 and the second insulating film through hole 131 are misaligned, after the first insulating film 12, the circuit board 141 and the second insulating film 13 are hot pressed, it can prevent the metal particle falling inside the battery module 10 through the connecting assembly 1.

As shown in FIG. 15, a width of the first insulating film through hole 121 in the embodiment is d and a width of the second insulating film through hole 131 is e. In the embodiment, the width d of the first insulating film through hole 121 is the same as the width e of the second insulating film through hole 131. Moreover, in order to improve the material utilization ratio of the circuit board 141 and ensure a sufficient bonding area of the insulating film and the circuit board 141, the width d of the first insulating film through hole 121 and the width e of the second insulating film through hole 131 in the embodiment have a range of [0.5 mm, 3 mm]. In some embodiments, the width d of the first insulating film through hole 121 and the width e of the second insulating film through hole 131 are both 1 mm.

In other embodiments, the width d of the first insulating film through hole 121 and the width e of the second insulating film through hole 131 may not be the same either.

In order to prevent the metal particle falling inside the module, a distance between hole walls disposed close to a first insulating film through hole 121 and a second insulating film through hole 131 in the embodiment is greater than or equal to −0.5 mm. At this time, the connecting assembly 1 still has an opening within 0.5 mm after being hot pressed. The metal particle within 0.5 mm can still fall inside the battery module 10 through the opening. That is, when c is greater than or equal to −0.5 mm, it can prevent most metal particles falling inside the battery module 10. In order to prevent the metal particle falling inside the battery module 10 better, a distance c between hole walls disposed close to a first insulating film through hole 121 and a second insulating film through hole 131 in the embodiment is in a range of [−0.5 mm, 3 mm]. In some embodiments, when a distance c between hole walls disposed close to a first insulating film through hole 121 and a second insulating film through hole 131 is 0.5 mm, the effects of the insulating film in preventing the metal particle falling inside in the embodiment and the effects of releasing the expansion force are better.

In some embodiments, in order to prevent stress concentration, as shown in FIG. 18, FIG. 19 and FIG. 21, end portions and corners of the insulating film through hole are transitioned with circular corners to prevent stress concentration.

Finally, it should be noted that the foregoing embodiments are merely intended to describe the technical solutions of the present application, but not intended to constitute any limitation. Although the present application is described in detail with reference to preferred embodiments, a person of ordinary skill in the art should understand that modifications or equivalent replacements of partial technical features can still be made to the specific embodiments of the present application, without departing from the spirit of the technical solutions of the present application, and shall fall within the scope of the technical solutions sought for protection in the present application.

What is claimed is:

1. A connecting assembly for a battery module, comprising:
   a plurality of connecting sheets configured to connect battery cells of the battery module;
   a sampling assembly comprising a circuit board and a sampling terminal connected to the circuit board, the sampling terminal being connected to the plurality of connecting sheets; and
   an insulating film disposed at one side of the sampling assembly and the plurality of connecting sheets, and the insulating film connecting the sampling assembly and the plurality of connecting sheets to form an integral structure with the sampling assembly and the plurality of connecting sheets, and an insulating film through hole being provided in a region of the sampling assembly covered by the insulating film;
   wherein the circuit board is provided with a circuit board opening, the circuit board opening comprises a circuit board through hole passing through the circuit board and a first groove formed by a side of the circuit board being recessed inward, the circuit board through hole comprises a first transverse section extending along a transverse direction of the circuit board, and the first groove is located in an extending direction of the first transverse section and has a gap with the first transverse section.

2. The connecting assembly according to claim 1, wherein a position of the insulating film through hole corresponds to a position of the circuit board opening.

3. The connecting assembly according to claim 2, wherein the circuit board is provided with a connecting portion connected to the sampling terminal, and the circuit board opening is disposed close to the connecting portion.

4. The connecting assembly according to claim 3, wherein the circuit board through hole further comprises a longitudinal section extending along a longitudinal direction of the circuit board, and the first transverse section is located at a first end of the longitudinal section and communicates to the longitudinal section.

5. The connecting assembly according to claim 4, wherein the circuit board through hole further comprises a second transverse section extending along the transverse direction of the circuit board, and the second transverse section is located at a second end of the longitudinal section and communicates to the longitudinal section.

6. The connecting assembly according to claim 5, wherein on the longitudinal direction of the circuit board, a distance between the second transverse section and the connecting portion is greater than a distance between the first transverse section and the connecting portion.

7. The connecting assembly according to claim 6, wherein the circuit board opening further comprises a second groove formed by a side of the circuit board being recessed inward, and the second groove and the first groove are respectively located at two sides of the connecting portion.

8. The connecting assembly according to claim 7, wherein a position of the insulating film through hole is disposed in correspondence to a position of the circuit board opening, and the insulating film through hole comprises a first segment corresponding to a position of the circuit board through hole and a second segment extending from a position corresponding to the second groove to a position corresponding to the first groove.

9. The connecting assembly according to claim 1, wherein the insulating film comprises a first insulating film and a second insulating film that are respectively attached to two sides of the sampling assembly and the plurality of connecting sheets, the first insulating film is provided with a first insulating film through hole and the second insulating film is provided with a second insulating film through hole.

10. The connecting assembly according to claim 9, wherein the first insulating film through hole and the second insulating film through hole are disposed in a misalignment manner.

11. The connecting assembly according to claim 10, wherein a distance range between hole walls disposed close to the first insulating film through hole and the second insulating film through hole is [−0.5 mm, 3 mm].

12. The connecting assembly according to claim 9, wherein a position of the first insulating film through hole and a position of the second insulating film through hole are opposite, a width of one insulating film through hole of the first insulating film through hole and the second insulating film through hole is smaller than a width of the other insulating film through hole.

13. The connecting assembly according to claim 12, wherein a width a of a narrow insulating film through hole of the first insulating film through hole and the second insulating film through hole is in a range of [0 mm, 0.5 mm] and a width b of a wide insulating film through hole of the first insulating film through hole and the second insulating film through hole is in a range of [0.5 mm, 3 mm].

14. A battery module comprising a plurality of battery cells disposed in a stack manner and a connecting assembly, the connecting assembly comprising:
- a plurality of connecting sheets configured to connect battery cells of the battery module;
- a sampling assembly comprising a circuit board and a sampling terminal connected to the circuit board, the sampling terminal being connected to the plurality of connecting sheets;
- an insulating film disposed at one side of the sampling assembly and the plurality of connecting sheets, and the insulating film connecting the sampling assembly and the plurality of connecting sheets to form an integral structure with the sampling assembly and the plurality of connecting sheets, and an insulating film through hole being provided in a region of the sampling assembly covered by the insulating film;
- wherein the circuit board is provided with a circuit board opening, the circuit board opening comprises a circuit board through hole passing through the circuit board and a first groove formed by a side of the circuit board being recessed inward, the circuit board through hole comprises a first transverse section extending along a transverse direction of the circuit board, and the first groove is located in an extending direction of the first transverse section and has a gap with the first transverse section;
- wherein the plurality of connecting sheets are connected to an electrode lead of the plurality of battery cells.

15. The battery module according to claim 14, wherein the circuit board is provided with a circuit board opening, and a position of the insulating film through hole corresponds to a position of the circuit board opening.

16. The battery module according to claim 15, wherein the circuit board is provided with a connecting portion connected to the sampling terminal, and the circuit board opening is disposed close to the connecting portion.

17. A device using a battery module as a power supply comprising a driving apparatus and a battery module, wherein the driving apparatus is configured to provide a driving force to the device, and the battery module is configured to provide electrical energy to the driving apparatus;
the battery module comprising a plurality of battery cells disposed in a stack manner and a connecting assembly, the connecting assembly comprising:
- a plurality of connecting sheets configured to connect battery cells of the battery module;
- a sampling assembly comprising a circuit board and a sampling terminal connected to the circuit board, the sampling terminal being connected to the plurality of connecting sheets;
- an insulating film disposed at one side of the sampling assembly and the plurality of connecting sheets, and the insulating film connecting the sampling assembly and the plurality of connecting sheets to form an integral structure with the sampling assembly and the plurality of connecting sheets, and an insulating film through hole being provided in a region of the sampling assembly covered by the insulating film;
- wherein the circuit board is provided with a circuit board opening, the circuit board opening comprises a circuit board through hole passing through the circuit board and a first groove formed by a side of the circuit board being recessed inward, the circuit board through hole comprises a first transverse section extending along a transverse direction of the circuit board, and the first groove is located in an extending direction of the first transverse section and has a gap with the first transverse section;

wherein the plurality of connecting sheets are connected to an electrode lead of the plurality of battery cells.

\* \* \* \* \*